(12) United States Patent
Yang

(10) Patent No.: US 12,084,316 B2
(45) Date of Patent: Sep. 10, 2024

(54) ANTI-ELECTROMAGNETIC INTERFERENCE TELESCOPIC BOOM AND CRANE

(71) Applicant: SANY MOBILE CRANES CO., Ltd., Hunan (CN)

(72) Inventor: Yunguang Yang, Hunan (CN)

(73) Assignee: SANY MOBILE CRANES CO., LTD., Hunan (CN)

( * ) Notice: Subject to any disclaimer, the term of this patent is extended or adjusted under 35 U.S.C. 154(b) by 219 days.

(21) Appl. No.: 17/905,035

(22) PCT Filed: Jan. 15, 2021

(86) PCT No.: PCT/CN2021/072146
§ 371 (c)(1),
(2) Date: Aug. 25, 2022

(87) PCT Pub. No.: WO2021/169660
PCT Pub. Date: Sep. 2, 2021

(65) Prior Publication Data
US 2023/0087681 A1 Mar. 23, 2023

(30) Foreign Application Priority Data

Feb. 26, 2020 (CN) .......................... 202010122266.9

(51) Int. Cl.
*B66C 13/12* (2006.01)
*B66C 13/18* (2006.01)
(Continued)

(52) U.S. Cl.
CPC .............. *B66C 13/12* (2013.01); *B66C 13/18* (2013.01); *B66C 23/701* (2013.01); *H03H 11/04* (2013.01)

(58) Field of Classification Search
CPC ........ B66C 13/12; B66C 13/18; B66C 23/701
See application file for complete search history.

(56) References Cited

U.S. PATENT DOCUMENTS 11,015,663 B2 * 5/2021 Shan ........................ B66C 13/12
2020/0124117 A1 * 4/2020 Shan ........................ B66C 13/12

FOREIGN PATENT DOCUMENTS

| CN | 102602839 A | 7/2012 |
|----|-------------|--------|
| CN | 103091583 A | 5/2013 |

(Continued)

OTHER PUBLICATIONS

CN 106561077A Machine Translation (Year: 2017).*
(Continued)

*Primary Examiner* — Emmanuel M Marcelo
*Assistant Examiner* — Juan J Campos, Jr.
(74) *Attorney, Agent, or Firm* — TraskBritt

(57) ABSTRACT

An anti-electromagnetic interference telescopic boom and a crane. The telescopic boom includes a first anti-interference module, a second anti-interference module and a cable drum; wherein the first anti-interference module, the second anti-interference module and the cable drum are all arranged on a telescopic boom of the crane, the first anti-interference module is connected to a first end of the cable drum, and the second anti-interference module is connected to a second end of the cable drum, the cable drum is configured to transmit a control signal and a power signal for a control system of the telescopic boom, the first anti-interference module is configured to filter and encrypt the control signal and the power signal, and the second anti-interference module is configured to re-filter, decrypt and amplify the control signal and the power signal.

10 Claims, 2 Drawing Sheets

(51) Int. Cl.
   *B66C 23/70* (2006.01)
   *H03H 11/04* (2006.01)

(56) References Cited

FOREIGN PATENT DOCUMENTS

| CN | 104512810 A | 4/2015 |
|---|---|---|
| CN | 106561077 A | 4/2017 |
| CN | 208516752 U | 2/2019 |
| CN | 111232839 A | 6/2020 |
| JP | H9086855 A | 3/1997 |
| JP | 2004-315170 A | 11/2004 |

OTHER PUBLICATIONS

Chinese First Office Action for Chinese Application No. 202010122266.9, dated Dec. 30, 2020, 7 pages with translation.
Chinese Notice of Allowance for Chinese Application No. 202010122266.9, dated May 19, 2021, 3 pages with translation.
International Written Opinion for International Application No. PCT/CN2021/072146, mailed Apr. 2, 2021, 8 pages (4 pages of English Translation and 4 pages of Original Document).
Chinese Search Report for Chinese Application No. 2020101222669, dated Dec. 22, 2020, 2 pages.
International Search Report for International Application No. PCT/CN2021/072146, mailed Apr. 2, 2021, 2 pages.

\* cited by examiner

ANTI-ELECTROMAGNETIC INTERFERENCE TELESCOPIC BOOM AND CRANE

CROSS-REFERENCE TO RELATED APPLICATIONS

This application is a national phase entry under 35 U.S.C. § 371 of International Patent Application PCT/CN2021/072146, filed Jan. 15, 2021, designating the United States of America and published as International Patent Publication WO 2021/169660 A1 on Sep. 2, 2021, which claims the benefit under Article 8 of the Patent Cooperation Treaty to Chinese Patent Application Serial No. 202010122266.9, filed Feb. 26, 2020.

TECHNICAL FIELD

The present disclosure relates to the field of anti-electromagnetic interference, and in particular, to an anti-electromagnetic interference telescopic boom and a crane.

BACKGROUND

With a process of modern industrialization, more and more large-volume and great-weight components and devices are installed, disassembled and transferred by a crane. A truck crane is more broadly used in various occasions due to its advantages of small occupation area, flexible transition and fast construction speed, etc.

A crane with a single-cylinder pinning barrel-type boom is an optimally selected technical direction for a large-tonnage and super-large-tonnage truck crane due to its special structure. A core element of the single-cylinder pinning barrel-type boom is a single-cylinder pinning control system in the barrel-type boom. At least one cable drum on which cables can be passively pulled out and actively retracted supplies power to the single-cylinder pinning control system since the control system moves back and forth with a telescopic cylinder barrel.

The traditional single-cylinder pinning control system in the barrel-type boom consists of a boom-tail junction box, a pull rope (length measurement) sensor, a cable drum, an in-boom controller, a solenoid valve, and a proximity switch (discrete input and output). When electromagnetic interference occurs, either it does not be dealt with, or shielding grounding is provided, which has a certain effect under mild interference, but in the case that there are many interference sources, such as radar stations, broadcasting towers, WeChat satellite transmission base stations, power plants, aluminum factories, simple shielding grounding cannot effectively shield electromagnetic interference signals.

BRIEF SUMMARY

In view of the problem above, embodiment of the present disclosure provides an anti-electromagnetic interference telescopic boom and a crane, which may address the problem of inability to effectively shield an electromagnetic interference signal.

An embodiment of the present disclosure provides an anti-electromagnetic interference telescopic boom, applied to a crane, including: a first anti-interference module, a second anti-interference module and a cable drum; the first anti-interference module, the second anti-interference module and the cable drum are all arranged on a telescopic boom of a crane, the first anti-interference module is connected to a first end of the cable drum, and the second anti-interference module is connected to a second end of the cable drum; and the cable drum is configured to transmit a control signal and a power signal for a control system of the telescopic boom, the first anti-interference module is configured to filter and encrypt the control signal and the power signal, and the second anti-interference module is configured to re-filter, decrypt and amplify the control signal and the power signal.

In an embodiment of the present disclosure, the first anti-interference module includes a first filtering unit and an encoding unit. The first filtering unit is configured to filter the control signal and the power signal and the encoding unit is configured to encrypt the control signal and the power signal.

In an embodiment of the present disclosure, the second anti-interference module includes a second filtering unit, a decoding unit, and an amplifying and restoring unit. The second filtering unit is configured to filter the control signal and the power signal, the decoding unit is configured to decrypt the control signal and the power signal encrypted by the encoding unit, and the amplifying and restoring unit is configured to amplify the control signal and the power signal.

In an embodiment of the present disclosure, the first anti-interference module further includes a first interface unit configured to be connected to a signal line of the cable drum.

In an embodiment of the present disclosure, the first interface unit includes a first controller area network (CAN) bus interface unit and a first power interface unit. The first CAN bus interface unit is configured to be connected to a CAN bus and the first power interface unit is configured to be connected to a power line.

In an embodiment of the present disclosure, the first anti-interference module further includes a first processor configured to identify a digital signal and an analog signal in the control signal.

In an embodiment of the present disclosure, the second anti-interference module further includes a second interface unit configured to be connected to the signal line of the cable drum.

In an embodiment of the present disclosure, the second interface unit includes a second CAN bus interface unit and a second power interface unit. The second CAN bus interface unit is configured to be connected to the CAN bus and the second power interface unit is configured to be connected to the power line.

In an embodiment of the present disclosure, the second anti-interference module further includes a second processor configured to identify a digital signal and an analog signal in the control signal.

An embodiment of the present disclosure further provides a crane, including the telescopic boom described above.

The present disclosure provides an anti-electromagnetic interference telescopic boom and crane, including a first anti-interference module, a second anti-interference module and a cable drum. The first anti-interference module, the second anti-interference module and the cable drum are all arranged on a telescopic boom of a crane, the first anti-interference module is connected to a first end of the cable drum, the second anti-interference module is connected to a second end of the cable drum, the cable drum is configured to transmit a control signal and a power signal for a control system of the telescopic boom, the first anti-interference module is configured to filter and encrypt the control signal and the power signal and the second anti-interference module is configured to re-filter, decrypt and amplify the control signal and the power signal. In the present disclosure, by providing the first anti-interference module and the second anti-interference module at two ends of the cable drum, and filtering, encrypting and decrypting the control signal and power signal transmitted in the cable drum, the electromagnetic interference signal can be filtered out, which addresses the problem that the electromagnetic interference signal cannot be shielded effectively in the related art.

BRIEF DESCRIPTION OF THE DRAWINGS

In order to more clearly illustrate the embodiment of the present disclosure or technical solutions in the related art, the drawings used in the descriptions of the embodiment or the related art will be briefly described below. The drawings in the following description are only certain embodiments of the present disclosure, and other drawings can be obtained according to the drawings without any creative work for those skilled in the field.

DETAILED DESCRIPTION

The solution in an embodiment of the present disclosure will be described clearly and completely below with reference to the drawings in the embodiment of the present disclosure. The described embodiment is a part of the embodiment of the present disclosure, rather than all of the embodiment. All other embodiment obtained by those ordinary technicians in the field based on the embodiment of the present disclosure without creative efforts shall fall within the protection scope of the present disclosure.

Embodiment 1

Figure 1:
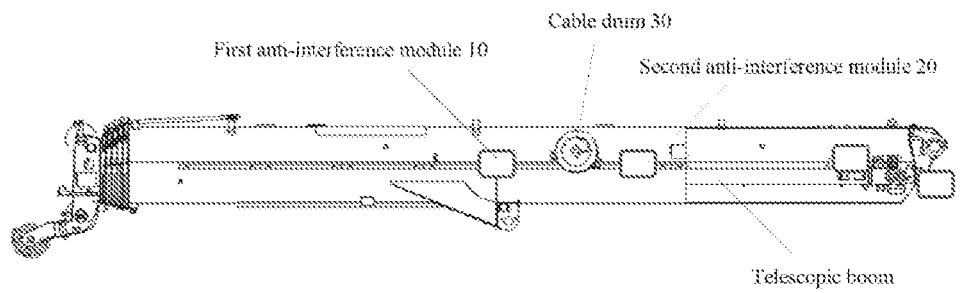
FIG. 1 is a schematic diagram of an anti-electromagnetic interference telescopic boom according to an embodiment of the present disclosure.

FIG. 1 is a schematic diagram of a first type of anti-electromagnetic interference telescopic boom according to an embodiment of the present disclosure, and the telescopic boom is applied to a crane. As shown in FIG. 1, the telescopic boom includes a first anti-interference module 10, a second anti-interference module 20 and a cable drum 30. The first anti-interference module 10, the second anti-interference module 20 and the cable drum 30 are all arranged on a telescopic boom of a crane, the first anti-interference module 10 is connected to a first end of the cable drum 30, and the second anti-interference module 20 is connected to a second end of the cable drum 30.

The cable drum 30 is configured to transmit a control signal and a power signal for a control system of the telescopic boom. For example, the cable drum 30 can be connected to the control system and electrical devices of the telescopic boom, and the electrical devices include a sensor, a controller and a display.

The first anti-interference module 10 is configured to filter and encrypt the control signal and the power signal.

The second anti-interference module 20 is configured to re-filter, decrypt and amplify the control signal and the power signal.

In the anti-electromagnetic interference telescopic boom according to the present disclosure, by providing an anti-interference module at both ends of the cable drum of the telescopic boom, the interference signal, together with the control signal and the power signal, is allowed to enter the first anti-interference module instead of being simply shielded and isolated when the interference signal is input into the control system of the telescopic boom. The filter processing is performed by the first anti-interference module to separate the control signal, the control signal and power signal are encrypted, and then the encrypted control signal and power signal are input into the second anti-interference module through the cable drum. The second anti-interference module is configured to re-filter, decrypt and amplify the encrypted control signal and power signal to output the filtered, decrypted and amplified control signal and power signal and thus the electromagnetic interference signal is filtered out, which addresses the problem that the electromagnetic interference signal cannot be shielded effectively in the related art.

Figure 2:
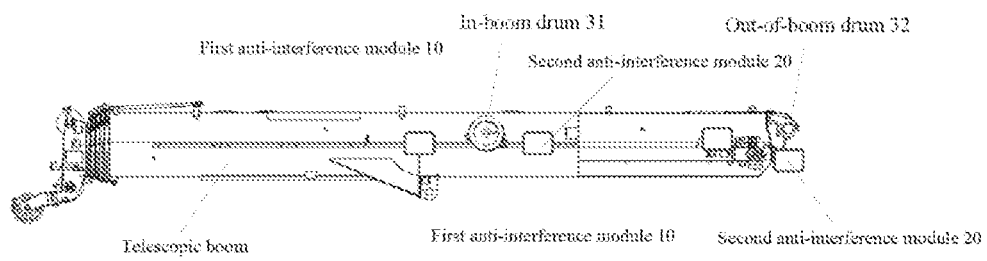
FIG. 2 is a schematic diagram of another anti-electromagnetic interference telescopic boom according to an embodiment of the present disclosure.

In an embodiment, FIG. 2 is a schematic diagram of a second type of anti-electromagnetic interference telescopic boom according to an embodiment of the present disclosure. As shown in FIG. 2, the cable drum 30 includes an in-boom drum 31 and an out-of-boom drum 32. The in-boom drum 31 is arranged inside the telescopic boom of the crane, and the out-of-boom drum 32 is arranged outside the telescopic boom of the crane. As shown in FIG. 2, the number of the first anti-interference modules 10 is two and the first anti-interference modules 10 are connected to the in-boom drum 31 and the out-of-boom drum 32, respectively; the number of the second anti-interference modules 20 is two and the second anti-interference modules 20 are connected to the in-boom drum 31 and the out-of-boom drum 32, respectively.

Figure 3:
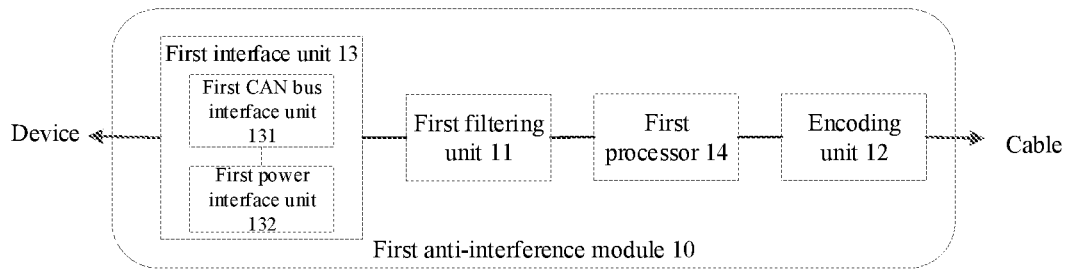
FIG. 3 is a schematic diagram of a first anti-interference module according to an embodiment of the present disclosure.

FIG. 3 is a schematic diagram of a first anti-interference module according to an embodiment of the present disclosure. As shown in FIG. 3, the first anti-interference module 10 includes a first filtering unit 11 and an encoding unit 12.

The first filtering unit 11 is configured to filter the control signal and the power signal.

The encoding unit 12 is configured to encrypt the control signal and the power signal.

In an embodiment, as shown in FIG. 3, the first anti-interference module 10 further includes a first interface unit 13 configured to be connected to a signal line of the cable drum.

In an embodiment, as shown in FIG. 3, the first interface unit 13 includes a first CAN bus interface unit 131 and a first power interface unit 132.

The first CAN bus interface unit 131 is configured to be connected to the CAN bus and the first power interface unit 132 is configured to be connected to the power line.

In an embodiment, as shown in FIG. 3, the first anti-interference module 10 further includes a first processor 14 configured to identify a digital signal and an analog signal in the control signal.

Figure 4:
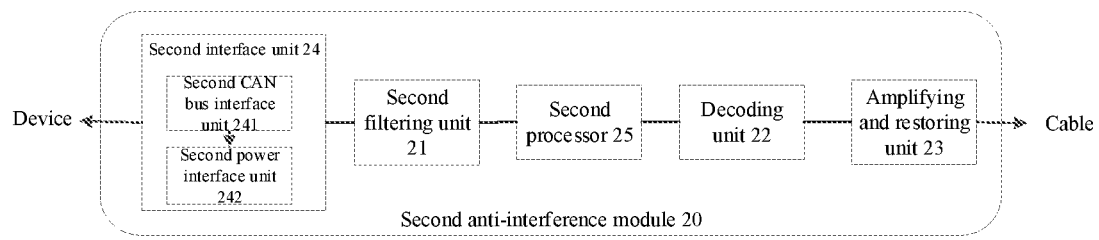
FIG. 4 is a schematic diagram of a second anti-interference module according to an embodiment of the present disclosure.

FIG. 4 is a schematic diagram of a second anti-interference module according to an embodiment of the present disclosure. As shown in FIG. 4, the second anti-interference module 20 includes a second filtering unit 21, a decoding unit 22 and an amplifying and restoring unit 23.

The second filtering unit 21 is configured to filter the control signal and the power signal.

The decoding unit 22 is configured to decrypt the control signal and the power signal encrypted by the encoding unit.

The amplifying and restoring unit 23 is configured to amplify the control signal and the power signal.

In an embodiment, as shown in FIG. 4, the second anti-interference module 20 further includes a second interface unit 24 configured to be connected to a signal line of the cable drum.

In an embodiment, as shown in FIG. 4, the second interface unit 24 includes a second CAN bus interface unit 241 and a second power interface unit 242.

The second CAN bus interface unit 241 is configured to be connected to the CAN bus, and the second power interface unit 242 is configured to be connected to a power line.

In an embodiment, as shown in FIG. 4, the second anti-interference module 20 further includes a second processor 25 configured to identify a digital signal and an analog signal in the control signal.

The embodiment of the present disclosure also provides a crane including an anti-electromagnetic interference telescopic boom according to the embodiment of the present disclosure.

By the anti-electromagnetic interference telescopic boom and the crane according to the embodiment of the present disclosure, the electromagnetic interference signal can be effectively filtered out when the crane works in an environment with electromagnetic interference and thus the control system is protected against shutdown failure and various electrical devices are prevented from being damaged by electromagnetic waves.

Embodiment 2

Figure 5:
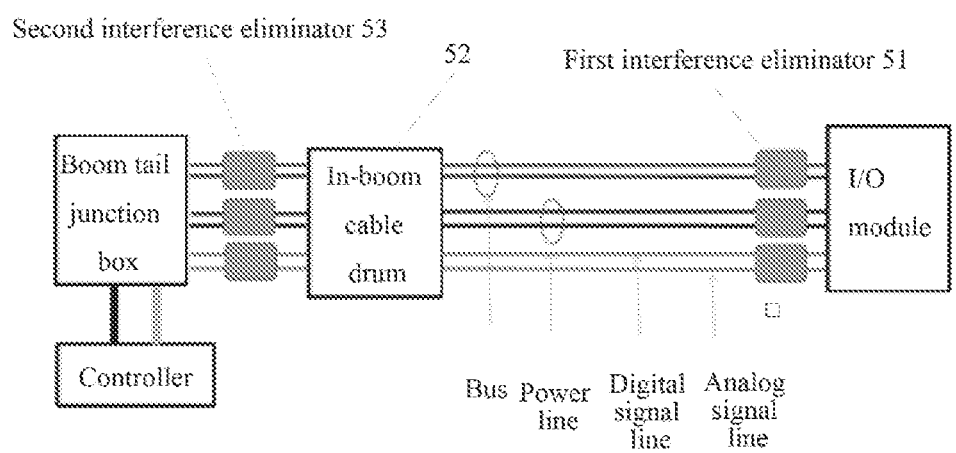
FIG. 5 is a schematic diagram of yet another anti-electromagnetic interference telescopic boom according to an embodiment of the present disclosure.

FIG. 5 is a schematic diagram of a third type of anti-electromagnetic interference telescopic boom according to an embodiment of the present disclosure. As shown in FIG. 5, the telescopic boom includes a first interference eliminator 51, an in-boom cable drum 52 and a second interference eliminator 53.

The first interference eliminator 51 is arranged between an I/O module and an in-boom cable drum 52 of the telescopic boom and configured to filter electrical signals in a bus, a power line, a digital signal line and an analog signal line between the I/O module and the in-boom cable drum 52. The I/O module is an I/O module of the sensor in the telescopic boom.

The second interference eliminator 53 is arranged between the boom tail junction box and the in-boom cable drum of the telescopic boom and configured to filter electrical signals in a bus, a power line, a digital signal line and an analog signal line between the in-boom cable drum and the boom tail junction box.

Another end of the boom tail junction box is connected to a controller of the telescopic boom.

Finally, it should be noted that the above embodiment are only used to illustrate the solutions of the present disclosure, but not to limit them; although the present disclosure has been described in detail with reference to the foregoing embodiment, those ordinary technicians in the field may still modify the solutions described in the foregoing embodiment, or equivalently replace some features thereof; while these modifications or replacements do not make the corresponding solutions deviate from the scope of the solutions in the embodiment of the present disclosure.

What is claimed is:

1. An anti-electromagnetic interference telescopic boom, applied to a crane, comprising: a first anti-interference module, a second anti-interference module and a cable drum; wherein the first anti-interference module, the second anti-interference module and the cable drum are all arranged on a telescopic boom of the crane, the first anti-interference module is connected to a first end of the cable drum, and the second anti-interference module is connected to a second end of the cable drum,
   the cable drum is configured to transmit a control signal and a power signal for a control system of the telescopic boom;
   the first anti-interference module is configured to filter and encrypt the control signal and the power signal; and
   the second anti-interference module is configured to re-filter, decrypt and amplify the control signal and the power signal.

2. The telescopic boom of claim 1, wherein the first anti-interference module comprises a first filtering unit and an encoding unit,
   wherein the first filtering unit is configured to filter the control signal and the power signal, and
   the encoding unit is configured to encrypt the control signal and the power signal.

3. The telescopic boom of claim 2, wherein the second anti-interference module comprises a second filtering unit, a decoding unit, and an amplifying and restoring unit,
   wherein the second filtering unit is configured to filter the control signal and the power signal,
   the decoding unit is configured to decrypt the control signal and the power signal encrypted by the encoding unit, and
   the amplifying and restoring unit is configured to amplify the control signal and the power signal.

4. The telescopic boom of claim 3, wherein the second anti-interference module further comprises a second interface unit, configured to be connected to a signal line of the cable drum.

5. The telescopic boom of claim 4, wherein the second interface unit comprises a second CAN bus interface unit and a second power interface unit, and
   the second CAN bus interface unit is configured to be connected to a first CAN bus and
   the second power interface unit is configured to be connected to a power line.

6. The telescopic boom of claim 3, wherein the second anti-interference module further comprises a second processor configured to identify a digital signal and an analog signal in the control signal.

7. The telescopic boom of claim 2, wherein the first anti-interference module further comprises a first interface unit configured to be connected to a signal line of the cable drum.

8. The telescopic boom of claim 7, wherein the first interface unit comprises a first controller area network (CAN) bus interface unit and a first power interface unit,
   the first CAN bus interface unit is configured to be connected to a CAN bus, and
   the first power interface unit is configured to be connected to a power line.

9. The telescopic boom of claim 2, wherein the first anti-interference module further comprises a first processor configured to identify a digital signal and an analog signal in the control signal.

10. A crane, comprising the telescopic boom of claim 1.

* * * * *